(12) United States Patent
Fu et al.

(10) Patent No.: US 10,342,156 B1
(45) Date of Patent: Jul. 2, 2019

(54) SERVER WITH AIRFLOW GUIDING STRUCTURE

(71) Applicant: Super Micro Computer Inc., San Jose, CA (US)

(72) Inventors: Chia-Yu Fu, San Jose, CA (US); Pei-Yu Wu, San Jose, CA (US); William Shen, San Jose, CA (US)

(73) Assignee: SUPER MICRO COMPUTER INC., San Jose, CA (US)

( * ) Notice: Subject to any disclaimer, the term of this patent is extended or adjusted under 35 U.S.C. 154(b) by 0 days.

(21) Appl. No.: 16/058,789

(22) Filed: Aug. 8, 2018

(51) Int. Cl.
- *G06F 1/16* (2006.01)
- *H05K 7/20* (2006.01)
- *H05K 7/14* (2006.01)
- *H05K 5/02* (2006.01)

(52) U.S. Cl.
CPC ....... *H05K 7/20145* (2013.01); *H05K 5/0213* (2013.01); *H05K 7/1487* (2013.01); *H05K 7/20172* (2013.01); *H05K 7/20736* (2013.01)

(58) Field of Classification Search
CPC ...................................................... G06F 1/20
USPC ............ 361/679.46, 679.47, 679.48, 679.49, 361/679.5
See application file for complete search history.

(56) References Cited

U.S. PATENT DOCUMENTS

| | | | | |
|---|---|---|---|---|
| 6,574,100 B1* | 6/2003 | Anderson | ............... | G06F 1/181 165/80.3 |
| 2004/0062002 A1* | 4/2004 | Barringer | ................. | G06F 1/18 361/679.4 |
| 2005/0111136 A1* | 5/2005 | Miyamoto | ............... | G06F 1/20 360/99.25 |
| 2015/0305206 A1* | 10/2015 | Fukuda | ................ | G11B 33/128 361/679.49 |
| 2016/0231791 A1* | 8/2016 | Peng | ........................ | G06F 1/20 |

* cited by examiner

*Primary Examiner* — Anthony Q Edwards
(74) *Attorney, Agent, or Firm* — Chun-Ming Shih; HDLS IPR Services (57) ABSTRACT

A server with an airflow guiding structure includes a chassis having a storage area, a computing area and a fan module installed between the storage area and the computing area. The storage area includes multiple storage modules, and the computing area includes a fan module and a motherboard electrically coupled to each storage module. The fan module has an air inlet configured to be corresponding to the storage area, an air outlet configured to be corresponsive to the computing area and an airflow guiding component with multiple airflow guiding ducts. The airflow guiding component is configured to be corresponsive to the air inlet. Therefore, the vibration of the fan module is reduced and the operation efficiency of the storage medium and the service life of the server are improved.

15 Claims, 10 Drawing Sheets

SERVER WITH AIRFLOW GUIDING STRUCTURE

FIELD OF THE INVENTION

This disclosure relates to a server and more particularly to the server with an airflow guiding structure.

BACKGROUND OF THE INVENTION

As the transmission efficiency and speed of network technologies increase constantly, computer servers are installed with storage modules such as floppy disk drive, hard disk drive (HDD), solid state drive (SSD), and burner to execute related operations to process huge data. However, the operation of the computer servers may generate heat to affect the performance of the storage modules or other adjacent electronic components, or even cause breakdowns of these storage modules, so that it is necessary to dissipate the heat to reduce the failure rate of the computer server.

To overcome the aforementioned heat dissipation issue, a high-performance cooling fan is installed in the chassis of the present existing storage modules to produce airflow to actively discharge the waste heat generated by the electronic devices to the outside. Although the high-performance cooling fan can accelerate the dissipation of the waste heat generated by the electronic devices, yet vibration and noise are generated by the high-frequency rotating vanes of the cooling fan and transmitted to the storage modules and other components through structure-borne or air-borne transmission paths along the chassis, so as to reduce the efficiency of the storage devices or other operating components, or even affect the service life of these components.

SUMMARY OF THE INVENTION

Therefore, it is a primary objective of this disclosure to provide a server with an airflow guiding structure capable of reducing the vibration of a fan module and improving the operation efficiency of a storage medium and the service life of the server.

Another objective of this disclosure is to provide a server with an airflow guiding structure and having an excellent structural strength to reduce the vibration of the structure and the transmission of the acoustic wave.

A further objective of this disclosure is to provide a server with an airflow guiding structure with simple structure, convenient installation, and low manufacturing cost.

To achieve the aforementioned and other objectives, this disclosure provides a server with an airflow guiding structure, comprising a chassis, including a storage area, a computing area, and a fan module installed between the storage area and the computing area, and the storage area having a plurality of storage modules installed therein, and the computing area including the fan module and a motherboard electrically coupled to each storage module, wherein the fan module has an air inlet configured to be corresponsive to the storage area and an air outlet configured to be corresponsive to the computing area, and the fan module has an airflow guiding component with a plurality of airflow guiding ducts, and the airflow guiding component is configured to be corresponsive to the air inlet.

In a specific embodiment, the fan module further comprises a fan frame, at least a fan installed in the fan frame, a bracket installed on a side of the fan frame, and a plurality of elastic members for positioning the fan frame on the chassis.

In a specific embodiment, the bracket has a plurality of hooks disposed on a side of the bracket, and the fan frame corresponding to each hook has a plurality of latch holes provided for fixing each hook onto the fan frame.

In a specific embodiment, the airflow guiding component is mounted onto the fan frame by the bracket, and the area of the fan frame is configured to be corresponsive to the area of the airflow guiding component.

In a specific embodiment, the fan frame has a plurality of first openings, and the bracket has a plurality of second openings formed thereon and configured to be corresponsive to the first openings respectively.

In a specific embodiment, each airflow guiding duct is configured to be corresponsive to each respective second opening, so that airflow passes from the air inlet through each second opening, each airflow guiding duct, each first opening, and then discharges from the air outlet to the outside.

In a specific embodiment, the cross section of each airflow guiding duct is in a honeycomb shape.

In a specific embodiment, the airflow guiding component has a channel length (thickness) from 5 mm to 10 mm.

In a specific embodiment, the cross section of each airflow guiding duct has a channel width (diameter) from 3 mm to 6 mm.

In a specific embodiment, the chassis further comprises a cover plate for covering the computing area and the fan module, and the cover plate has a plurality of first heat dissipating holes configured to be corresponsive to the fan module and a plurality of second heat dissipating holes configured to be corresponsive to the computing area.

In a specific embodiment, the server further comprises two side panels vertically coupled to the chassis, and each side panel having at least a first rib installed between the fan module and the storage area.

In a specific embodiment, the chassis has a plurality of second ribs and a plurality of third ribs disposed at the bottom of the chassis.

In a specific embodiment, the second ribs are separated from one another and configured to be corresponsive to the fan module and the computing area.

In a specific embodiment, the third ribs are coupled to each other and configured to be corresponsive to the storage area.

In a specific embodiment, the chassis further comprises a back panel installed between the storage area and the fan module, and each storage module is electrically coupled to the motherboard through the back panel.

This embodiment further has the following advantages: By the fan module installed with the airflow guiding component, the elastic member of the fan module, and each rib installed onto the chassis, the vibration (including air-borne or structure-borne transmission) produced during the operation of the fan module can be reduced to improve the operation efficiency of each storage medium and the service life of the server.

DESCRIPTION OF THE PREFERRED EMBODIMENTS

The technical contents of this disclosure will become apparent with the detailed description of preferred embodiments accompanied with the illustration of related drawings as follows. It is intended that the embodiments and figures disclosed herein are to be considered illustrative rather than restrictive.

Figure 1:
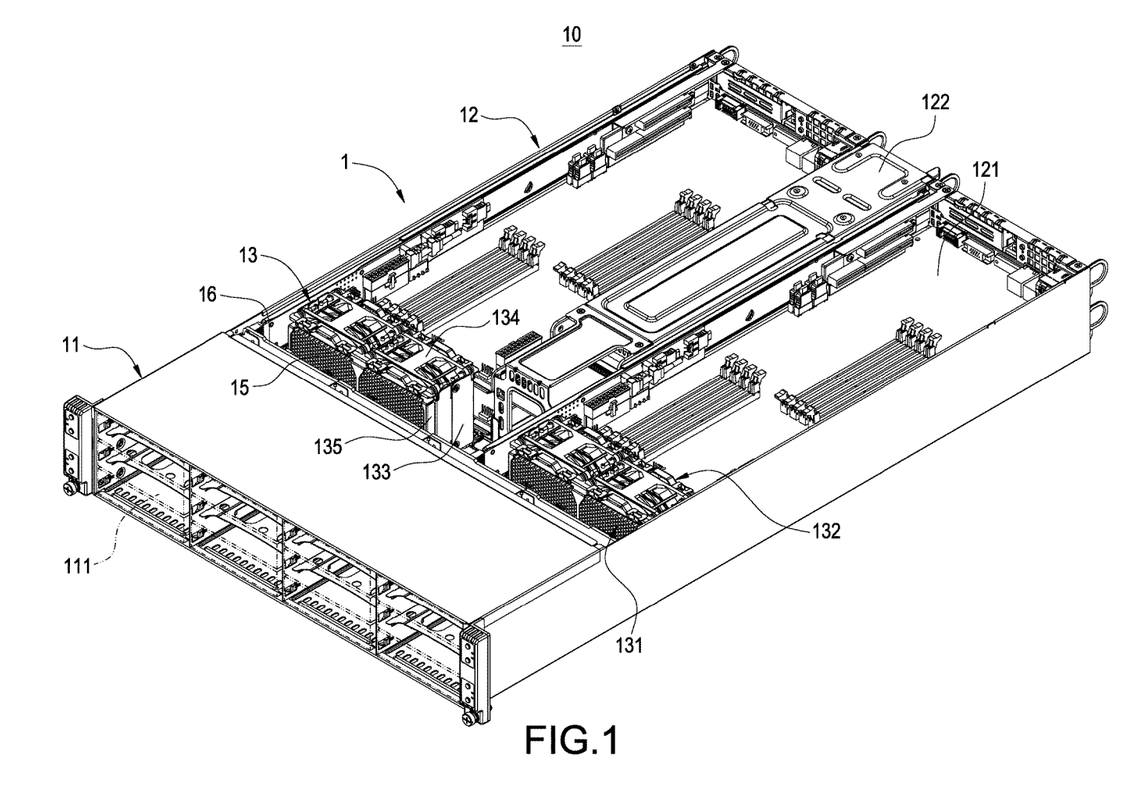
FIG. 1 is a perspective view of a server with an airflow guiding structure of this disclosure.
Figure 2:
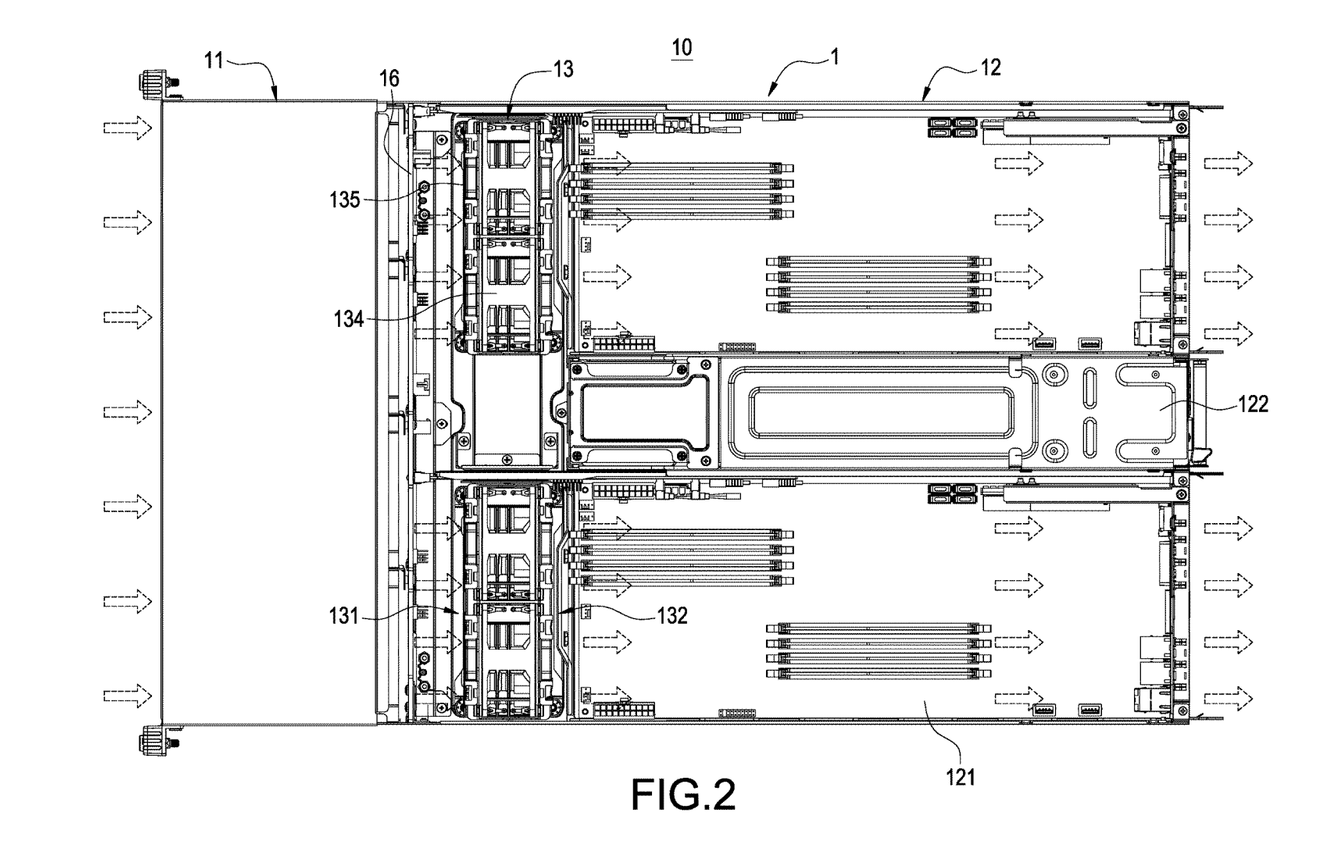
FIG. 2 is a bottom view of a server with an airflow guiding structure of this disclosure.

With reference to FIGS. 1 and 2 for a server with an airflow guiding structure in accordance with this disclosure, the server with an airflow guiding structure 10 comprises a chassis 1 and a frame (not shown in the figures) of the chassis 1. The chassis 1 includes a storage area 11, a computing area 12, and a fan module 13 installed between the storage area 11 and the computing area 12. The storage area 11 has a plurality of storage modules 111, each including but not limited to a traditional Hard Disk Drive (HDD), a Solid State Hybrid Drive (SSHD) and a Solid State drive (SSD). Each storage module 111 is inserted and connected to the storage area 11 by a method such as stacking the storage modules 111 onto the bottom plate of the chassis 1 parallelly. The computing area 12 has a fan module 13 and a motherboard 121 electrically coupled to each storage module 111.

In an embodiment as shown in FIGS. 1 and 2, the computing area 12 preferably includes two motherboards 121 separated by a power supply device 122, and the quantity of fan modules 13 is preferably a group, and each fan module 13 is configured to be corresponsive to each respective motherboard 121. In addition, the chassis 1 further comprises a back panel 16 installed between the storage area 11 and the fan module 13. Each storage module 111 is electrically coupled to the corresponding motherboard 121 through the back panel 16 for performing short message, video/image and e-mail related computations or operations.

Figure 4:
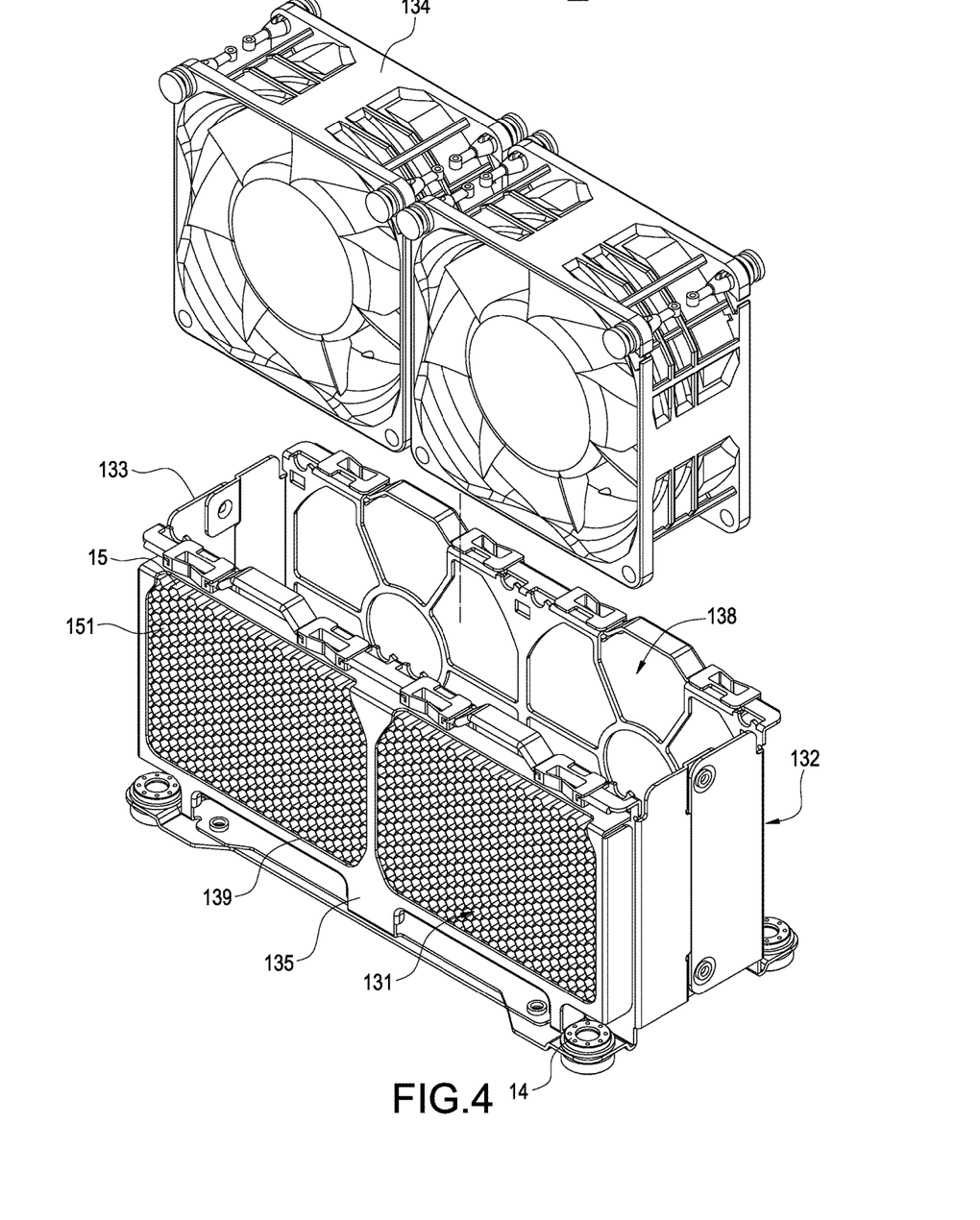
FIG. 4 is another exploded view of a fan module of this disclosure.
Figure 5:
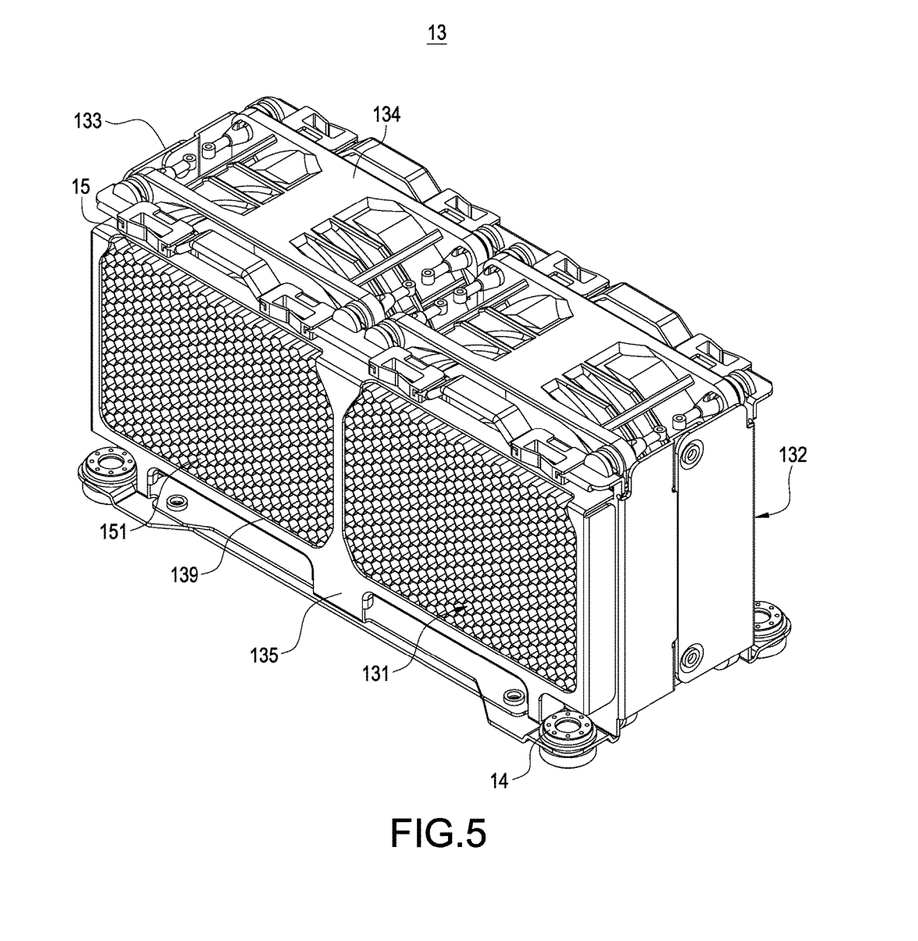
FIG. 5 is a perspective view of a fan module of this disclosure.
Figure 6:
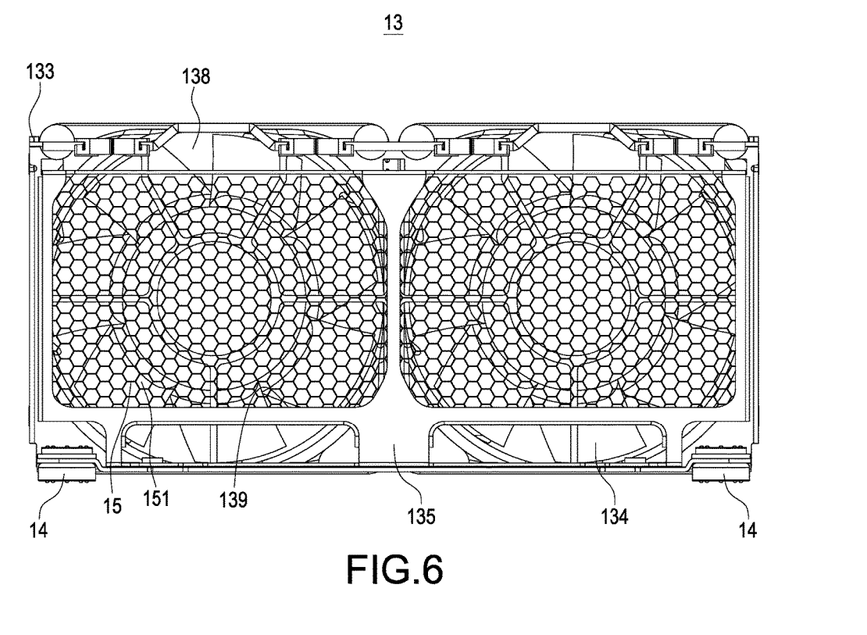
FIG. 6 is a side view of a fan module of this disclosure.

With reference to FIGS. 4 to 6, the fan module 13 further comprises an air inlet 131 configured to be corresponsive to the storage area 11 and an air outlet 132 configured to be corresponsive to the computing area 12. The fan module 13 has an airflow guiding component 15 with a plurality of airflow guiding ducts 151, and the airflow guiding component 15 is configured in a direction corresponding to the air inlet 131 for guiding disordered or unstable airflow into the fan module 13 and then discharging the airflow from the air outlet 132 to the outside.

Figure 3:
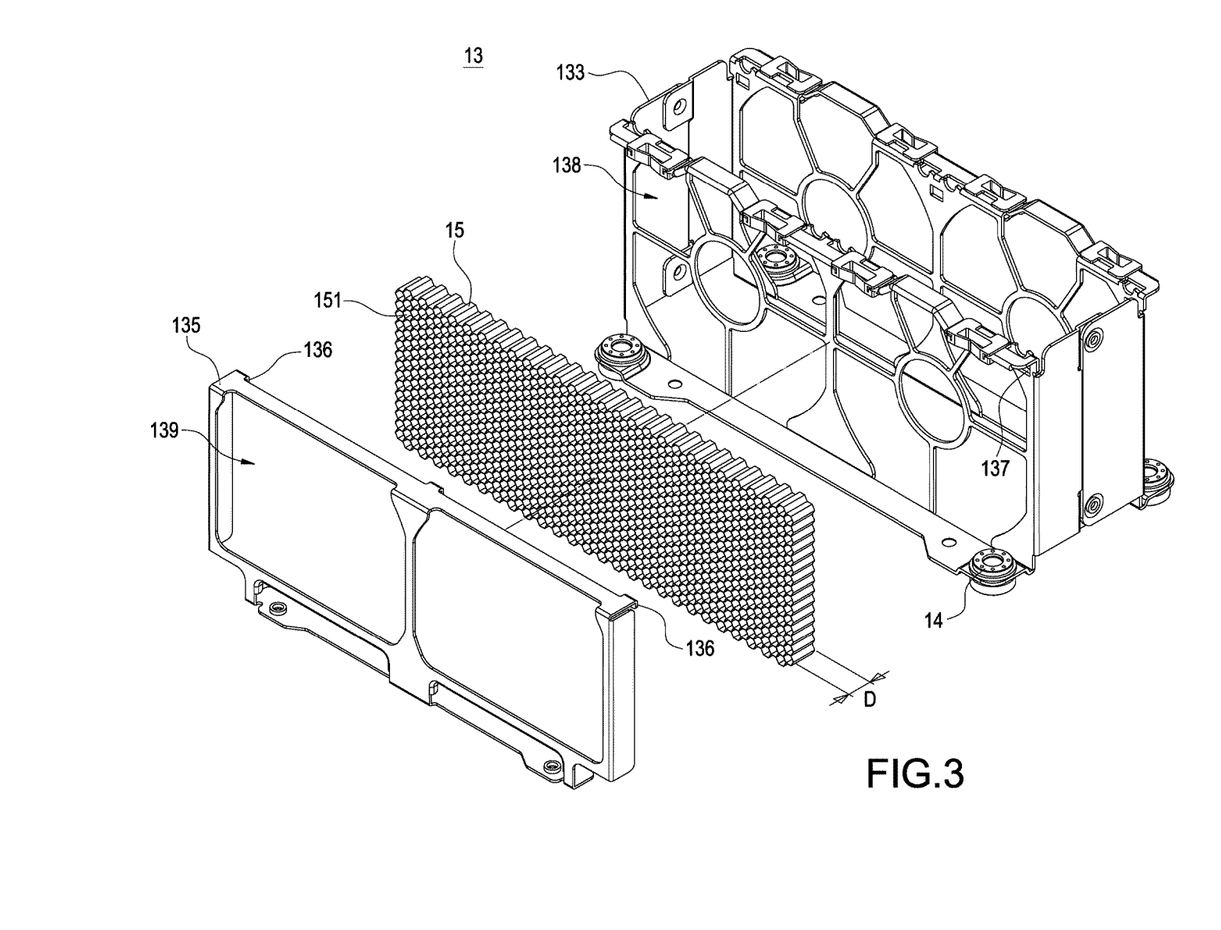
FIG. 3 is an exploded view of a fan module of this disclosure.

The fan module 13 further comprises a fan frame 133, at least a fan 134 installed into the fan frame 133, a bracket 135 installed onto a side of the fan frame 133, and a plurality of elastic members 14 for positioning the fan frame 133 onto the chassis 1. In an embodiment as shown in FIG. 3, the bracket 135 further has a plurality of hooks 136 disposed on a side of the bracket 135 and separated from one another, and the fan frame 133 has a plurality of latch holes 137 configured to be corresponsive to the hooks 136 respectively, so that each hook 136 is latched and fixed to the fan frame 133, so that the airflow guiding component 15 can be fixed onto the fan frame 133 by the bracket 135. In an embodiment as shown in FIG. 4, a pair of axial fans is preferably accommodated in the rectangular fan frame 133, wherein the quantity and type of the fans 134 may be changed as needed.

Figure 7:
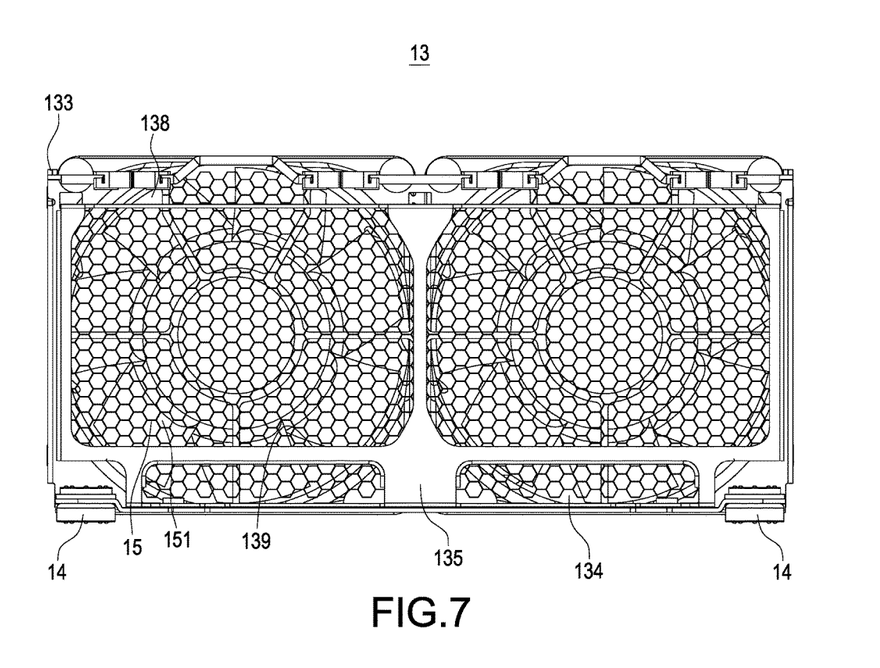
FIG. 7 is another side view of a fan module of this disclosure.

In an embodiment as shown in FIGS. 3 to 6, the airflow guiding component 15 is preferably in the shape of a rectangular plate clamped between the bracket 135 and the fan frame 133. In an embodiment as shown in FIG. 7, a part of the airflow guiding component 15 may be in a circular shape in correspondence with the shape of each fan 134, or the airflow guiding components 15 may be distributed all over the whole fan frame 133 to improve the guiding and unifying effects. In addition, the elastic member 14 as shown in FIGS. 3 to 7 is preferably made of rubber, silicone, or any other appropriate buffer material, so that the vibration produced during the operation of the fan module 13 may be absorbed by each elastic member 14 to prevent the vibration from being transmitted to the outside through the chassis 1 by a structure-borne transmission.

The fan frame 133 further has a plurality of first openings 138, and the bracket 135 has a plurality of second openings 139 configured to be corresponsive to the first openings 138 respectively to facilitate the circulation of the cooling airflow. Each first opening 138 and each second opening 139 are designed with a size as large as possible while taking a specific structural strength into consideration. When the fan 134 of the fan module 13 is operated at a high speed, a cooling airflow sequentially passes from the air inlet 131 through each second opening 139, each airflow guiding duct 151 and each first opening 138, and then discharges from the air outlet 132 to the outside. Since each airflow guiding duct 151 of the airflow guiding component 15 can guide the airflow into the fan module 13 consistently and uniformly, therefore the fan 134 can be operated stably and smoothly to reduce the vibration and the noise. In other words, the installed airflow guiding component 15 can reduce the turbulence of the airflow and the generation of noises effectively, so as to minimize the vibration induced by air-borne transmission.

Figure 8:
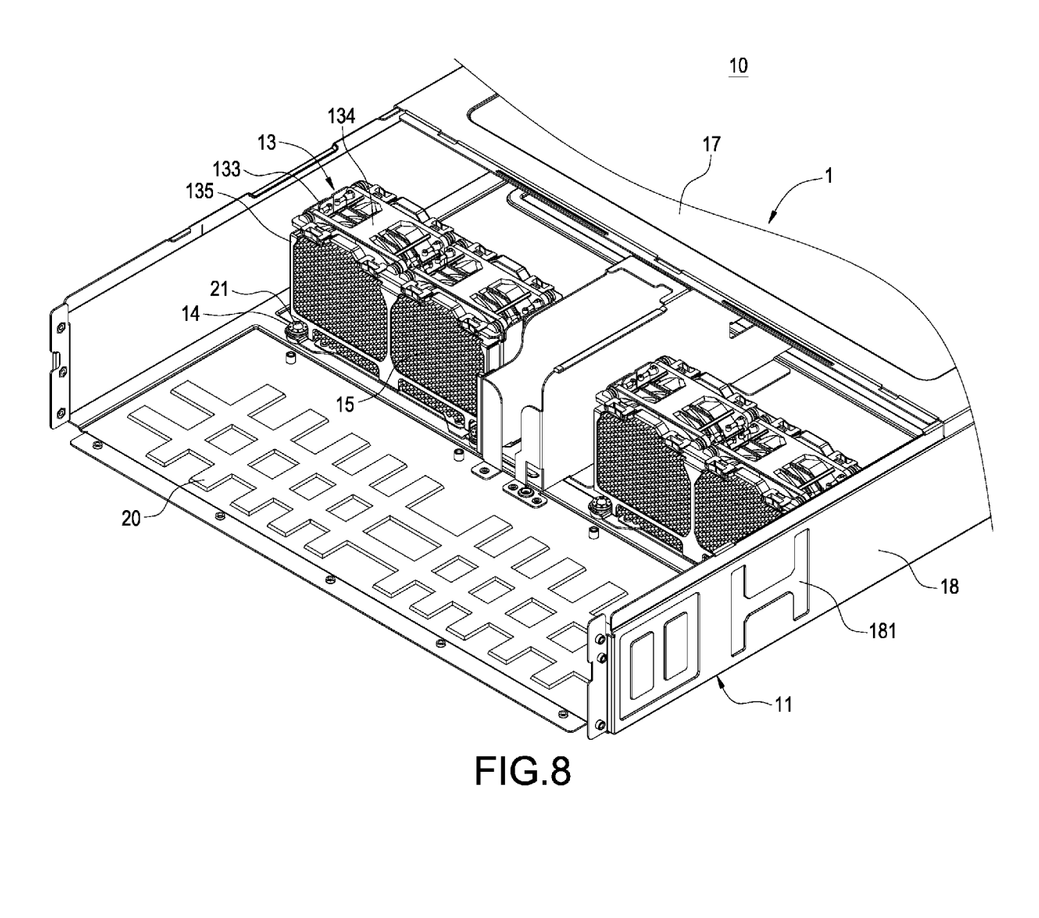
FIG. 8 is a perspective view of a fan module installed in a chassis in accordance with this disclosure.
Figure 9:
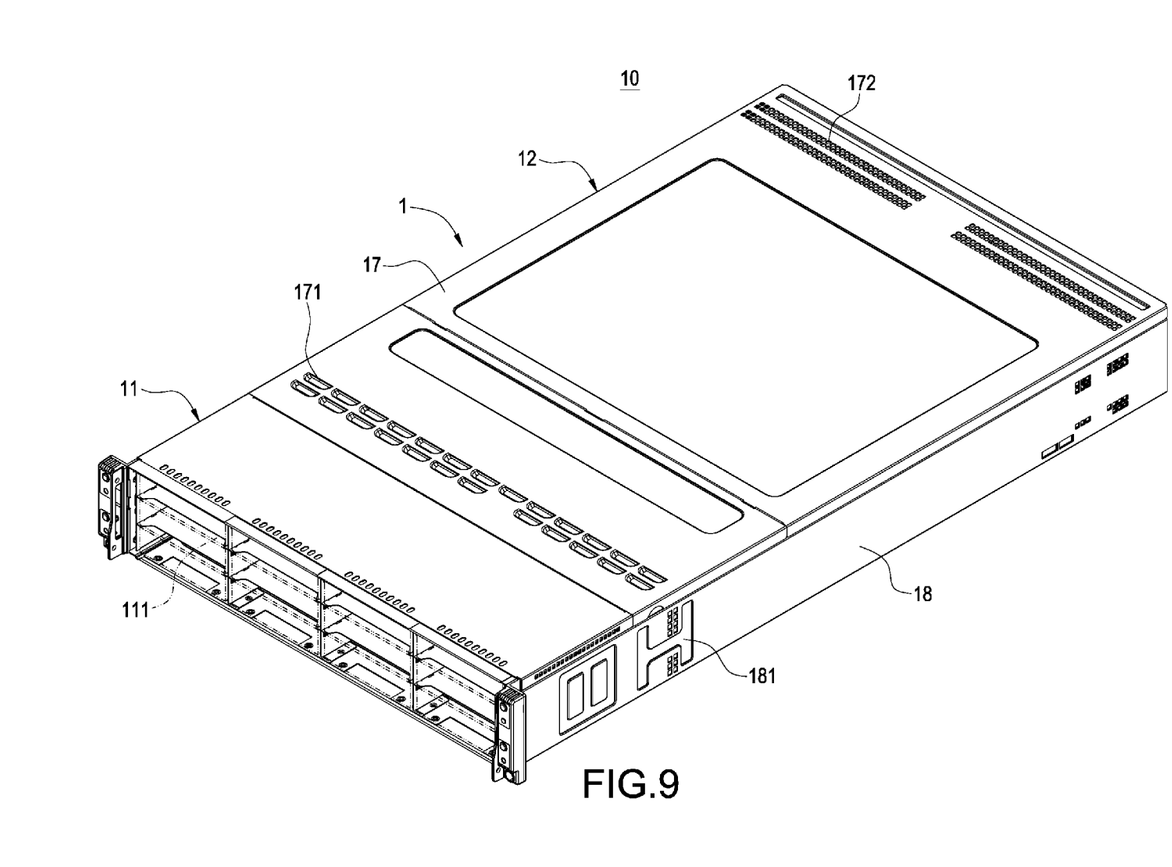
FIG. 9 is a perspective view of a server with an airflow guiding structure covered by a cover plate in accordance with this disclosure.
Figure 10:
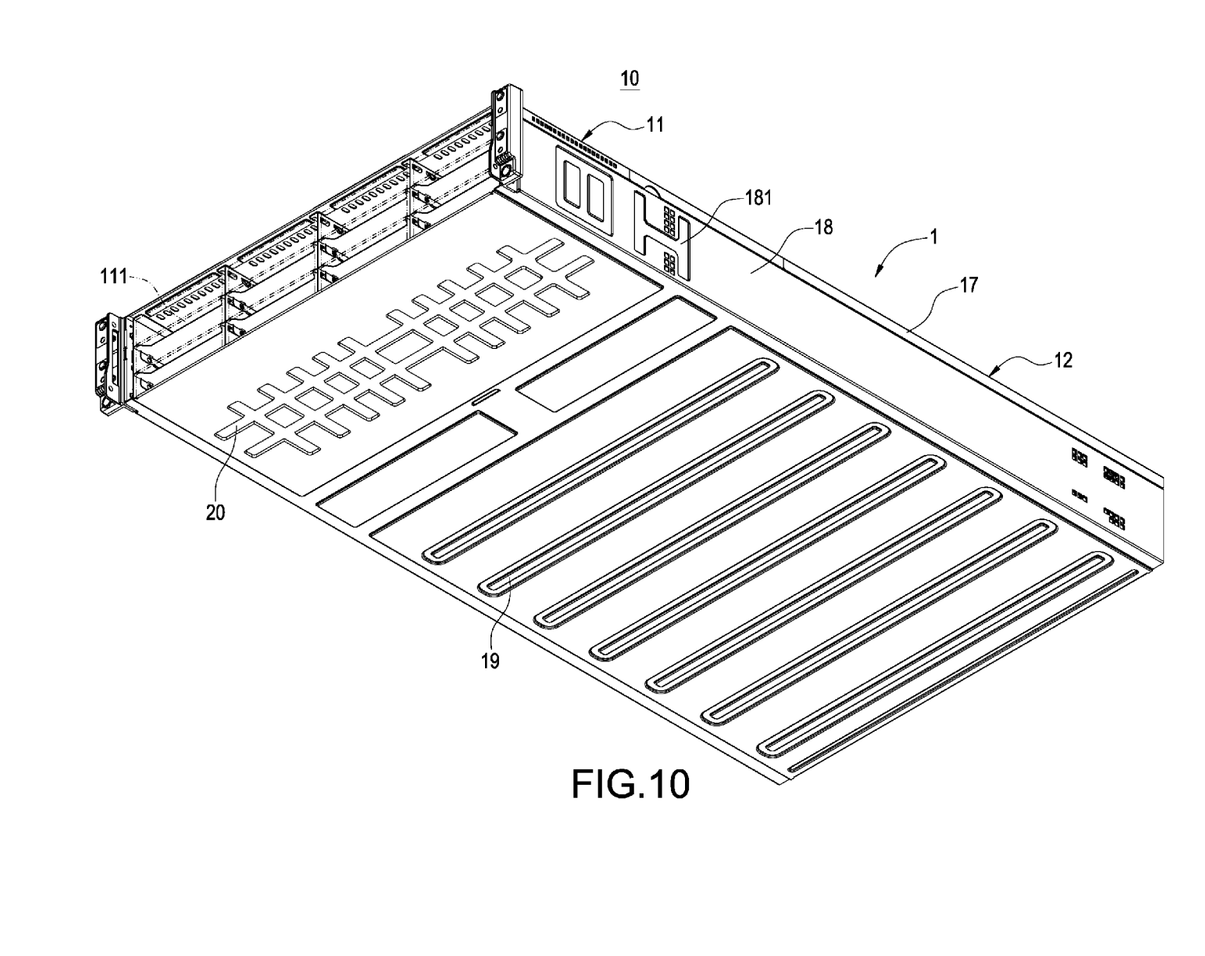
FIG. 10 is another perspective view of a server with an airflow guiding structure of this disclosure.

In FIGS. 8 to 10, the server 10 of this disclosure has a plurality of ribs 181, 19, 20 of different structures to increase the structural strength of the chassis 1, and lower the vibration by the operation of the fan module 13 or transmitting the vibration through a structure-borne transmission. In an embodiment as shown in FIGS. 8 to 10, the server 10 further comprises two side panels 18 vertically coupled to the chassis 1, and each side panel 18 has at least a first rib 181 disposed at a position corresponding to the position between the fan module 13 and the storage area 11.

The chassis 1 further has a plurality of second ribs 19 and a plurality of third ribs 20 disposed at the bottom of the chassis 1. The second ribs 19 are separated from one another and configured to be corresponsive to the fan module 13 and the computing area 12, and the third ribs 20 are coupled with one another and configured to be corresponsive to the storage area 11. The structure of each first rib 181, each second rib 19 and each third rib 20 is preferably protruded from the outside towards the interior of the chassis 1. In other words, the external structure of the chassis 1 is in a concave shape to increase the structural strength of the chassis 1, so that the vibration generated by the operation of the fan module 13 will not produce a resonance easily.

In FIG. 8, the bottom plate of the chassis 1 configured to be corresponsive to the elastic member 14 of each fan module 13 further includes a positioning pin 21 protruded therefrom and provided for fixing each fan module 13 conveniently and directly to save the assembling time. In FIG. 9, the chassis 1 further comprises a cover plate 17 for covering the computing area 12 and the fan module 13. The cover plate 17 has plurality of first heat dissipating holes 171 configured to be corresponsive to the fan module 13 and a plurality of second heat dissipating holes 172 configured to be corresponsive to the computing area 12, so that the airflow enters into the air inlet 131 from each first heat dissipating hole 171, and passes through the air outlet 132 of the fan module 13 and then discharges from each second heat dissipating hole 172 or a port (not shown in the figure) to the outside.

The cross section of the airflow guiding duct 151 of the airflow guiding component 15 is preferably honeycomb shaped (which is in the shape of a hexagonal structure) as shown in the figure. However, the cross section of the airflow guiding duct 151 is not limited to have a honeycomb shape. The airflow guiding component 15 preferably has a thickness duct channel length from 5 mm to 10 mm, and each airflow guiding duct 151 preferably has a channel width (diameter) from 3 mm to 6 mm, wherein the channel length of the airflow guiding component 15 is preferably greater than the duct width of each airflow guiding duct 151, and these numerical values may be adjusted as needed, so that the cooling airflow can be guided into the fan module 13 successfully to reduce the occurrence of turbulence, so as to reduce the vibration induced by the fan module 13 through the structure-borne transmission and airborne transmission and improve the operation efficiency of each storage module 111 in the computing area 11 and the service life of the server effectively.

When the fan module 13 in the chassis 1 is operated at a high speed, the heat generated during the operation of each storage module 111 is dissipated to the outside actively. Since the fan 134 of the fan module 13 can guide airflow into the fan 134 through each airflow guiding duct 151 of the airflow guiding component 15 consistently and uniformly, such arrangement not just reduces the turbulence of airflow inside the chassis 1 only, but also facilitates the operation of the fan 134 to lower the tonal noise and reduce the vibration produced during the operation of the fan module 13, so as to improve the operation efficiency of each storage medium 111 and the service life of the server. In addition, the chassis 1 has a reinforced structure to reduce the structure-borne transmission of vibration effectively.

This embodiment has the following advantages: The fan module 13 of the airflow guiding component 15 has the feature of a simple overall structure, a convenient installation, and a low manufacturing cost. The fan module 13 can be applied extensively in present existing servers 10.

In summation of the description above, this disclosure is novel, useful, and inventive and complies with the patent application requirements, and is thus duly filed for patent application. While this disclosure has been described by means of specific embodiments, numerous modifications and variations could be made thereto by those skilled in the art without departing from the scope and spirit of this disclosure set forth in the claims.

What is claimed is:

1. A server with an airflow guiding structure, comprising:
   a chassis, including a storage area, a computing area, and a fan module installed between the storage area and the computing area, and the storage area having a plurality of storage modules installed therein, and the computing area including the fan module and a motherboard electrically coupled to each storage module, wherein the fan module has an air inlet configured to be corresponsive to the storage area and an air outlet configured to be corresponsive to the computing area, and the fan module has an airflow guiding component with a plurality of airflow guiding ducts, and the airflow guiding component is configured to be corresponsive to the air inlet.

2. The server with an airflow guiding structure according to claim 1, wherein the fan module further comprises a fan frame, at least a fan installed in the fan frame, a bracket installed on a side of the fan frame, and a plurality of elastic members for positioning the fan frame on the chassis.

3. The server with an airflow guiding structure according to claim 2, wherein the bracket has a plurality of hooks disposed on a side of the bracket, and the fan frame corresponding to each hook has a plurality of latch holes provided for fixing each hook onto the fan frame.

4. The server with an airflow guiding structure according to claim 2, wherein the airflow guiding component is mounted onto the fan frame by the bracket, and the area of the fan frame is configured to be corresponsive to the area of the airflow guiding component.

5. The server with an airflow guiding structure according to claim 2, wherein the fan frame has a plurality of first openings, and the bracket has a plurality of second openings formed thereon and configured to be corresponsive to the first openings respectively.

6. The server with an airflow guiding structure according to claim 5, wherein each airflow guiding duct is configured to be corresponsive to each respective second opening, so that airflow passes from the air inlet through each second opening, each airflow guiding duct, each first opening, and then discharges from the air outlet to the outside.

7. The server with an airflow guiding structure according to claim 1, wherein each airflow guiding duct has a honeycomb cross section (or a hexagonal shape).

8. The server with an airflow guiding structure according to claim 1, wherein the airflow guiding component has a thickness (channel length) from 5 mm to 10 mm.

9. The server with an airflow guiding structure according to claim 1, wherein each airflow guiding duct has a channel width (diameter) from 3 mm to 6 mm.

10. The server with an airflow guiding structure according to claim 1, wherein the chassis further comprises a cover plate for covering the computing area and the fan module, and the cover plate has a plurality of first heat dissipating holes configured to be corresponsive to the fan module and a plurality of second heat dissipating holes configured to be corresponsive to the computing area.

11. The server with an airflow guiding structure according to claim 1, further comprising two side panels vertically coupled to the chassis, and each side panel having at least a first rib installed between the fan module and the storage area.

12. The server with an airflow guiding structure according to claim 1, wherein the chassis has a plurality of second ribs and a plurality of third ribs disposed at the bottom of the chassis.

13. The server with an airflow guiding structure according to claim 12, wherein the second ribs are separated from one another and configured to be corresponsive to the fan module and the computing area.

14. The server with an airflow guiding structure according to claim 12, wherein the third ribs are coupled to each other and configured to be corresponsive to the storage area.

15. The server with an airflow guiding structure according to claim 1, wherein the chassis further comprises a back panel installed between the storage area and the fan module, and each storage module is electrically coupled to the motherboard through the back panel.

* * * * *